United States Patent
Wu et al.

(10) Patent No.: US 9,673,324 B1
(45) Date of Patent: Jun. 6, 2017

(54) MOS DEVICE WITH EPITAXIAL STRUCTURE ASSOCIATED WITH SOURCE/DRAIN REGION AND METHOD OF FORMING THE SAME

(71) Applicant: UNITED MICROELECTRONICS CORP., Hsin-Chu (TW)

(72) Inventors: Tien-I Wu, Taoyuan (TW); I-Cheng Hu, Kaohsiung (TW); Yu-Shu Lin, Pingtung County (TW); Shu-Yen Chan, Changhua County (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/246,522

(22) Filed: Aug. 24, 2016

(30) Foreign Application Priority Data

Jul. 5, 2016 (TW) .............................. 105121207 A

(51) Int. Cl.
*H01L 29/78* (2006.01)
*H01L 29/66* (2006.01)

(52) U.S. Cl.
CPC .... *H01L 29/7846* (2013.01); *H01L 29/66553* (2013.01); *H01L 29/66795* (2013.01); *H01L 29/785* (2013.01); *H01L 29/7842* (2013.01); *H01L 29/7849* (2013.01); *H01L 29/7853* (2013.01)

(58) Field of Classification Search
CPC . H01L 29/78; H01L 29/7811; H01L 29/7823; H01L 29/7842; H01L 29/7846; H01L 29/785; H01L 29/7851; H01L 29/7853
See application file for complete search history.

(56) References Cited

U.S. PATENT DOCUMENTS

| | | | |
|---|---|---|---|
| 7,538,387 B2 | 5/2009 | Tsai | |
| 7,696,019 B2 * | 4/2010 | Han | H01L 29/165 257/213 |
| 7,781,799 B2 | 8/2010 | Yu | |
| 2015/0236157 A1 * | 8/2015 | Kwok | H01L 29/7848 257/192 |
| 2016/0027918 A1 * | 1/2016 | Kim | H01L 29/7848 257/401 |

* cited by examiner

*Primary Examiner* — Eduardo A Rodela
(74) *Attorney, Agent, or Firm* — Winston Hsu; Scott Margo

(57) ABSTRACT

The present invention provides a metal oxide semiconductor (MOS) device, including a substrate, a gate structure on the substrate and a source/drain region disposed in the substrate at one side of the gate structure and in at least a part of an epitaxial structure, wherein the epitaxial structure includes a first buffer layer, which is an un-doped buffer layer, including a bottom portion disposed on a bottom surface of the epitaxial structure and a sidewall portion disposed on a concave sidewall of the epitaxial structure, an epitaxial layer which is encompassed by the first buffer layer, and a semiconductor layer which is disposed between the first buffer layer and the epitaxial layer. The source/drain region is disposed in the epitaxial structure.

20 Claims, 6 Drawing Sheets

US 9,673,324 B1

MOS DEVICE WITH EPITAXIAL STRUCTURE ASSOCIATED WITH SOURCE/DRAIN REGION AND METHOD OF FORMING THE SAME

BACKGROUND OF THE INVENTION

1. Field of the Invention

The present invention is related to a metal oxide semiconductor (MOS) device and method of forming the same, and more particularly, to a MOS device with good electricity and less dislocation and a method of forming the same.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

The present invention therefore provides a MOS device and a method of forming the same, which can exhibit better electrical performance.

According to one embodiment, the present invention provides a metal oxide semiconductor (MOS) device, including a substrate, a gate structure on the substrate and a source/drain region disposed in the substrate at one side of the gate structure and in at least a part of an epitaxial structure, wherein the epitaxial structure includes a first buffer layer, which is an un-doped buffer layer, including a bottom portion disposed on a bottom surface of the epitaxial structure and a sidewall portion disposed on a concave sidewall of the epitaxial structure, an epitaxial layer which is encompassed by the first buffer layer, and a semiconductor layer which is disposed between the first buffer layer and the epitaxial layer. The source/drain region is disposed in the epitaxial structure.

According to another embodiment, the present invention provides a method of forming a MOS device. First, a substrate is provided, with a gate structure disposed thereon. Then, an epitaxial structure is formed in the substrate at two sides of the gate structure, wherein the step of forming the epitaxial structure comprises: forming a recess in the substrate, wherein the recess comprises a recess bottom surface and a recess side surface; forming a first buffer layer in the recess, wherein the first buffer layer is an un-doped buffer layer and includes a bottom portion and a side portion, wherein the bottom portion is disposed on a bottom surface of the epitaxial structure, the side portion is disposed on a sidewall of the epitaxial structure; forming a semiconductor layer on the first buffer layer; and forming an epitaxial layer on the semiconductor layer, wherein the epitaxial layer is a strained layer and the epitaxial layer completely fill the recess. Lastly, a source/drain region is formed in the epitaxial structure.

The MOS device provided in the present invention can provide superior electrical performance and avoid forming dislocation, thereby upgrading the performance of the device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
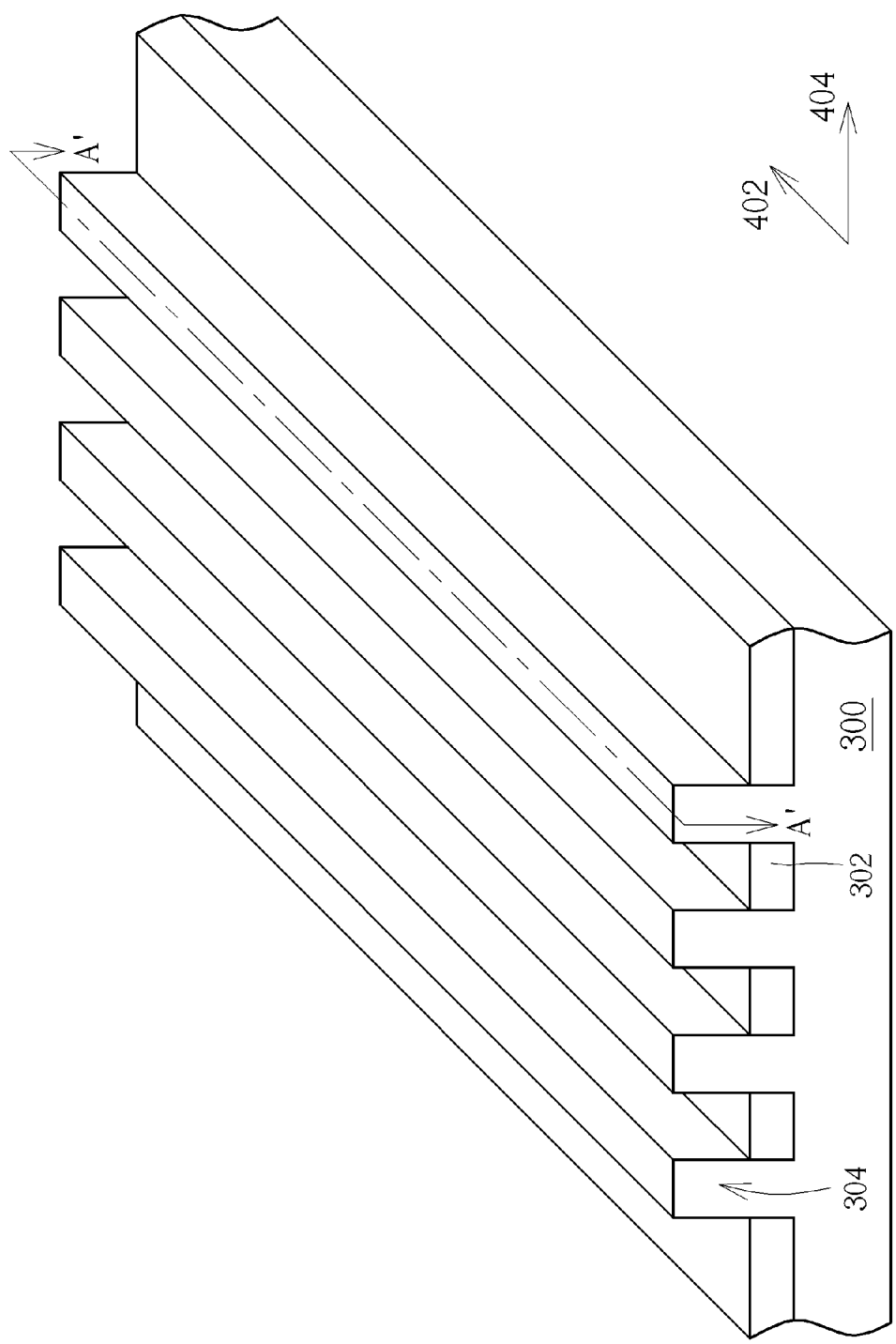
FIG. 1 to FIG. 9 show schematic diagrams of the method of forming a MOS device according to one embodiment of the present invention.
Figure 2:
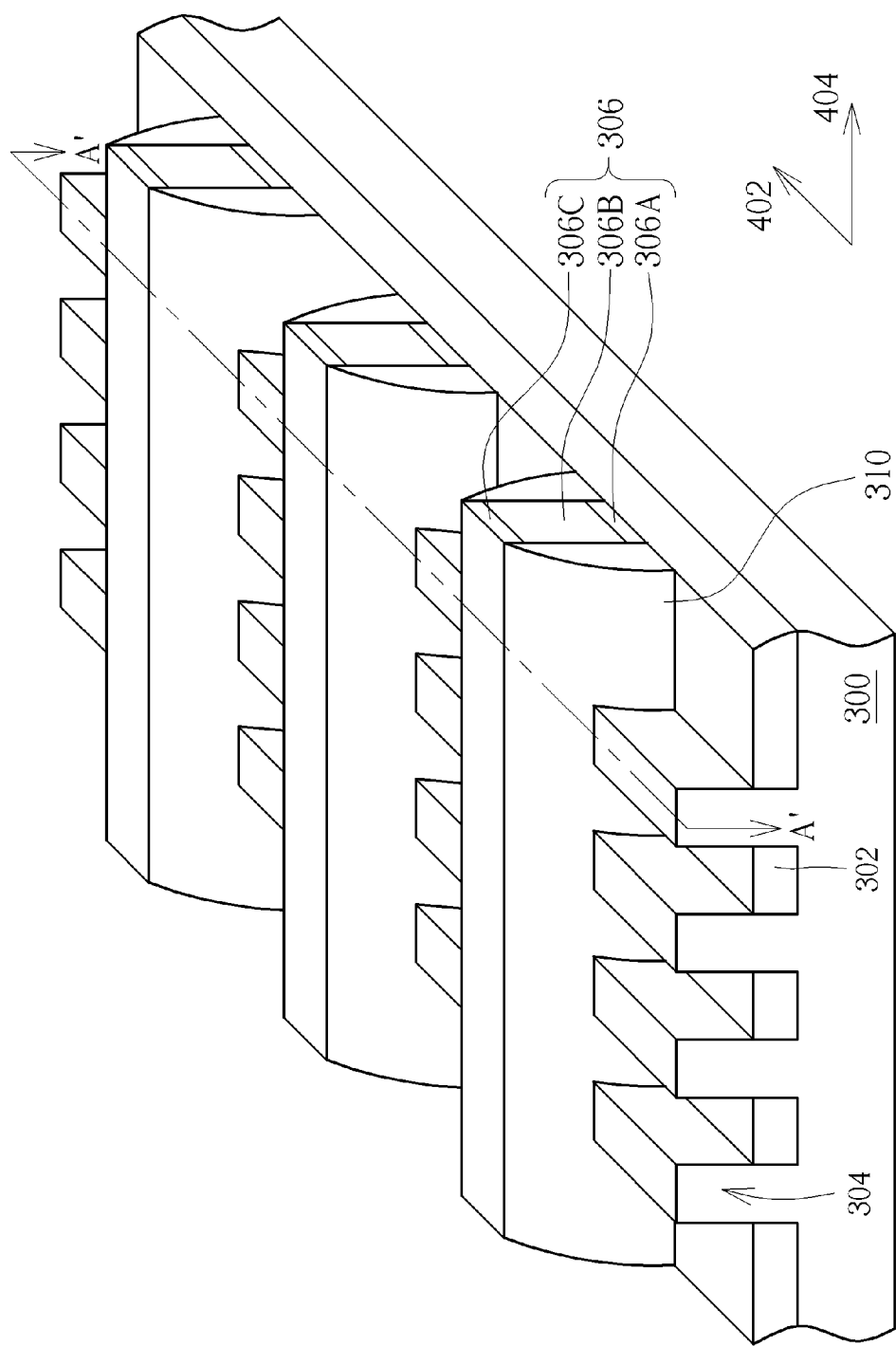

Please refer to FIG. 1 to FIG. 9, showing schematic diagrams of the method for forming a MOS device according to one embodiment of the present invention, wherein FIG. 1 and FIG. 2 are three-dimensional view and FIG. 3 to FIG. 9 are cross-sectional views taken along line AA' in FIG. 1 and FIG. 2.

Please see FIG. 1. A semiconductor substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. A plurality of fin structures 304 and a plurality of shallow trench isolations (STI) 302 are disposed on the substrate 300. As shown in FIG. 1, the fin structures 304 generally extend along a first direction 402, and are arranged with the STIs 302 alternatively. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said STIs 302. As a result, the sunken portion of the substrate 300 above STI 302 becomes the fin structures 304.

As shown in FIG. 2, a plurality of gate structures 306 are formed on the substrate 300. The gate structures 306 generally extend along a second direction 404 which is substantially perpendicular to the first direction 402. In one embodiment, the gate structure 306 includes (from bottom to top) a gate dielectric layer 306A, a conductive layer 306B and a capping layer 306C. In one embodiment, the gate dielectric layer 306A, includes $SiO_2$ or high-k dielectric materials, such as a material having dielectric constant greater than 4. The conductive layer 306B can include metal or poly-silicon. The capping layer 306C includes, for example, silicon nitride (SiN), silicon carbide (SiC) or silicon oxynitride (SiON). In one embodiment, the capping layer 306C may be one or multi layers composed of different dielectric materials. For example, the capping layer 306C may comprise a first capping layer (not shown) and a second capping layer (not shown), which is composed of $SiO_2$ and SiN, respectively. A spacer 310 may be formed on at least a sidewall of the gate structure 306. The spacer 310 can be a single layer or a composite layer, which is composed of high temperature oxide (HTO), silicon nitride, silicon oxide or silicon nitride (HCD-SiN) formed by hexachlorodisilane, $Si_2Cl_6$). In one embodiment, prior to forming the spacer 310, an ion implantation process can be selectively performed to form a light doped drain (LDD) 308 in the fin structure 304 (or the substrate 300) at two sides of the gate structure 306 (LDD 308 is now shown in FIG. 2 but is shown in the following figures). In one embodiment, the LDD 308 has a first conductive type dopant. When the subsequently formed transistor is a P-type transistor, the first conductivity type dopant is P type dopant, such as boron (B) and/or boron fluoride (BF). Conversely, if the transistor is an N-type transistor, the first conductivity type dopant an N-type dopant such as arsenic (As) and/or phosphorus (P) and/or antimony (Sb), but are not limited thereto.

Figure 3:
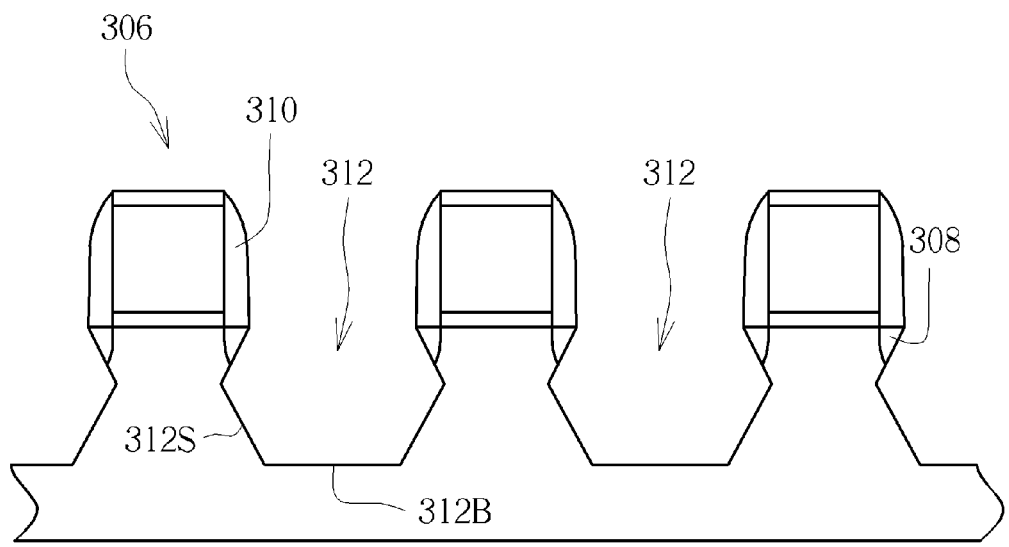

As shown in the cross-sectional view of FIG. 3, one or more than one etching process is performed to form at least one recess 312 in the fin structure 304 (or the substrate 300) at at least one side of the gate structure 306. In one preferred embodiment of the present invention, the recess 312 has a relatively horizontal bottom surface 312B and a sidewall 312S having concave shape sunken into the substrate 300, such as a diamond shape or other polygon shape sidewall. In another embodiment, the recess 312 may also be formed by a wet etching process and comprises a diamond or hexagonal shape in cross-section. After the recess 312 is formed, a pre-clean process is selectively conducted by using cleaning agent such as diluted hydrofluoric acid (HF) or Piranha solution (also called "SPM") that contains sulfuric acid ($H_2SO_4$), hydrogen peroxide ($H_2O_2$), and deionized water to remove native oxide or other impurities from the surface of the recess 312.

Figure 4:
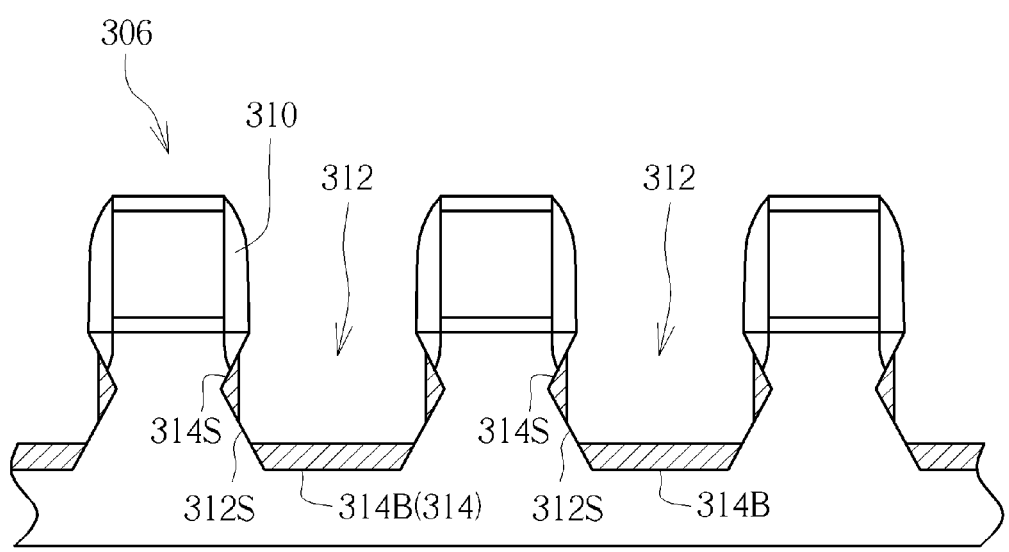

As shown in FIG. 4, a first buffer layer 314 is formed in the recess 312, covering a surface of the fin structure 304 (or the substrate 300) in the recess 312. In one embodiment, when the subsequently formed transistor is an N type transistor, the material of the first buffer layer 314 may include silicide phosphorus (SiP) or silicon carbon (SiC); while the subsequently formed transistor is a P type transistor, the material of the first buffer layer 314 may include silicide germanium (SiGe). It is one salient feature in the present invention that the first buffer layer 314 includes a bottom portion 314B and a side portion 314S. The bottom portion 314B covers the bottom surface 312B of the recess 312 and preferably completely convers the bottom surface 312B. The side portion 314S covers the sidewall 312S and preferably forms from the most concave portion (the corner) of the sidewall 312S and gradually fills the concave sidewall 312S. As such, after completely filling into the concave sidewall 312S, the side portion 314S of the first buffer layer 314 contains a relatively vertical sidewall, showing a an isosceles triangle in its cross section. It is noted that the bottom portion 314B of the first buffer layer 314 does not contact the side portion 314S of the first buffer 314. Thus, an upper surface and a lower surface of the sidewall 312B of the recess are exposed. The method for forming the first buffer layer 312 comprises a first selective epitaxial growth (SEG) process. In one embodiment, the first SEG process is a "growing in combination of etching" process, meaning that during the epitaxial growing process, an etching gas such as HCl is also applied, thereto change the etching/deposit (E/D) ratio. In detail, at the beginning of the first SEG process, the etching ratio is turned on in a higher speed, making most of the epitaxial layer grow on the bottom surface 312B of the recess; Thereafter, the etching ratio is turned at a lower speed, such that the semiconductor material such as Ge can growth along (1,0,0) surface and start to be formed on the sidewall 314S. Accordingly, in one embodiment, a maximum thickness of the bottom portion 314B of the first buffer layer 314 is greater than a maximum thickness of the side portion 314S of the first buffer layer 314. It is another salient feature in the present invention of the first buffer layer 314 that it does not contain any semiconductor conductive dopant, such as III/V dopant, thereto serve as an un-doped region.

Figure 5:
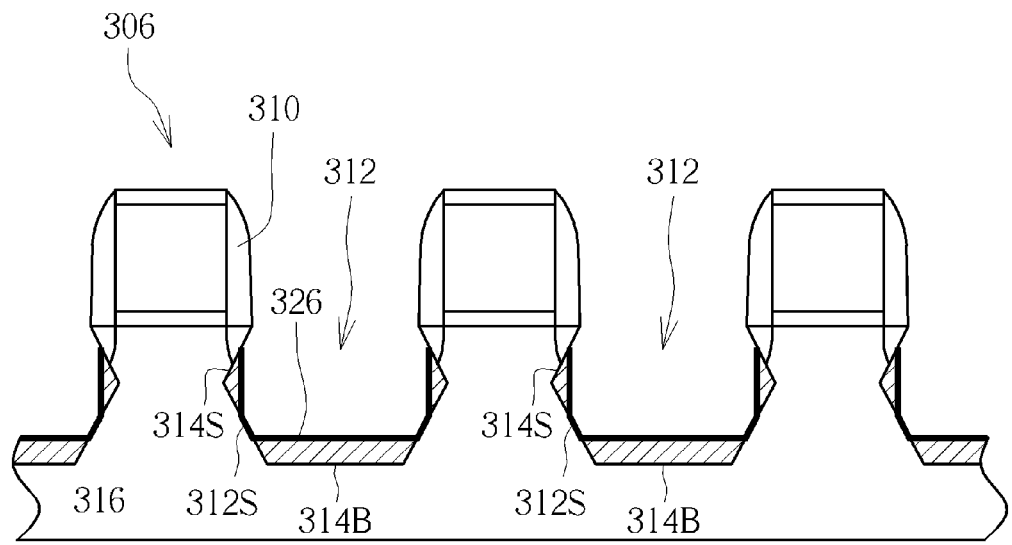

As shown in FIG. 5, after forming a first buffer layer 314, a semiconductor layer 326 can be selectively formed in the recess 312, covering the bottom portion 314B and the side portion 314S of the first buffer layer 314, and the surface of the recess sidewall 312S. The material of the semiconductor layer 326 preferably is single crystal silicon, with a thickness of about 50 angstroms.

Figure 6:
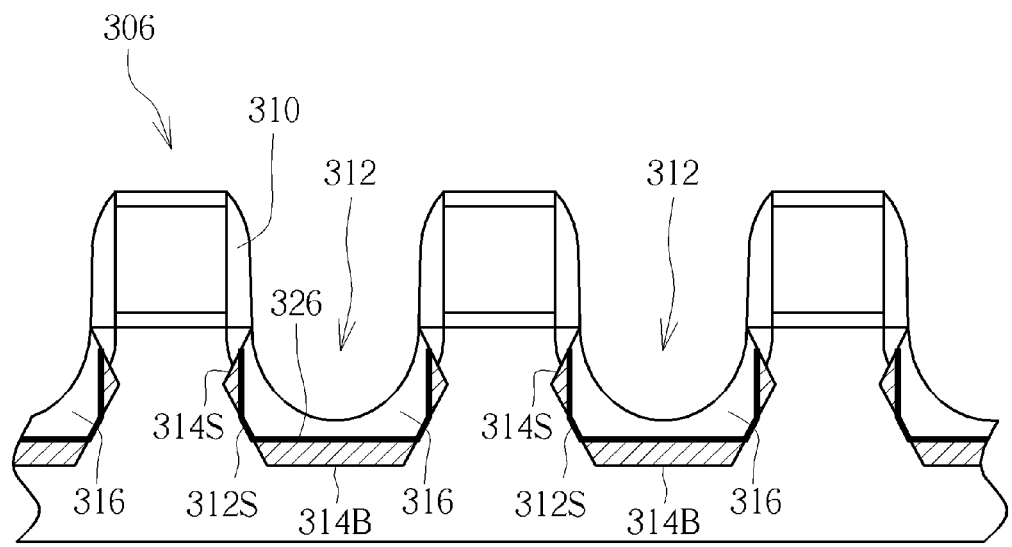

As shown in FIG. 6, a second buffer layer 316 is formed in the recess 312, covering the semiconductor layer 326. The material of the second buffer layer 316 is substantially the same as that of the first buffer layer 314. In one embodiment, a concentration of germanium (P-type transistor) or the carbon/phosphorus (N-type transistor) in the second buffer layer 316 is greater than a concentration of germanium (P-type transistor) or carbon/phosphorus (N-type transistor) in the first buffer layer 314. Preferably, the Ge concentration of the second buffer layer 316 has a gradient increasing forward to the opening of the recess 312. Besides, the second buffer layer 316 in the present invention has a second conductive type, which is complementary to the first conductive type mentioned above. In one embodiment, the second buffer layer 314 is formed by a second SEG process and is conducted by using a lower etching rate comparing to the first SEG process so as to form a more stable second buffer layer 316. Preferably, the second buffer layer 316 has a curved surface facing the opening. Since the second buffer layer 316 has the second conductivity type dopant, in one embodiment, the second buffer layer 316 can be formed in situ by introducing a second conductivity type doped during the second SEG process. While in another embodiment, it can be performed by conducting an implantation process after all the SEG processes. Furthermore, it is another feature in the present invention that a semiconductor layer 326 is disposed between the first buffer layer 314 and the second buffer layer 316, wherein the semiconductor layer 326 is composed of very thin layer of single crystal, such as single crystal silicon. By doing this, the stress between the first buffer layer 314 and the second buffer layer 316 can be released so as to obtain the first buffer layer 314 and the second buffer layer 316 with good lattice crystal.

Figure 7:
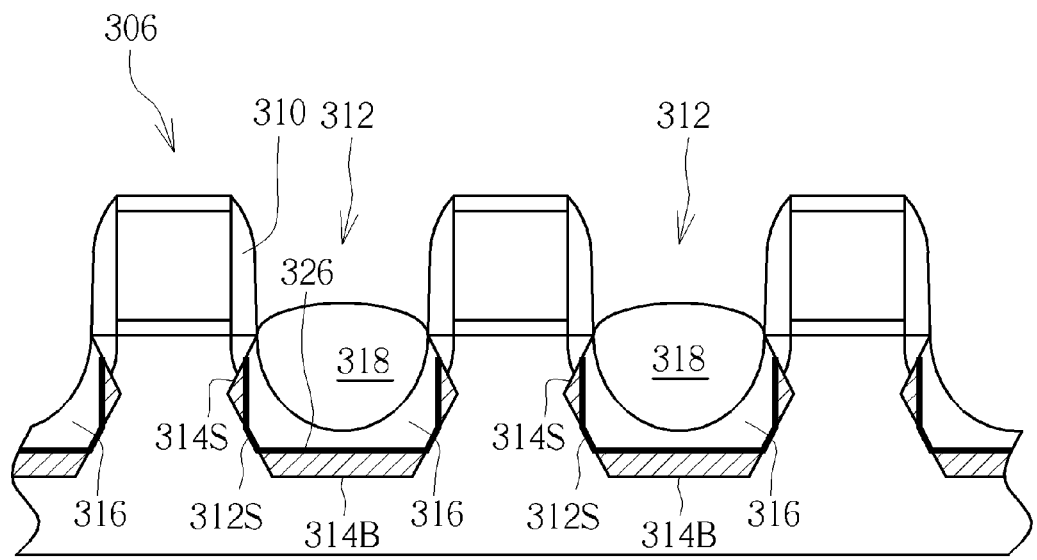

Next, as shown in FIG. 7, an epitaxial layer 318 is formed on the second buffer layer 316. In one embodiment, the epitaxial layer 318 completely fills the recess 312, and slightly protrudes from the recess 312. Alternatively, a top surface of the epitaxial layer 318 can be located at an opening of the recess 312 and leveled with a top of fin structure 304. In one embodiment, a concentration of germanium (P-type transistor) or the carbon/phosphorus (N-type transistor) in the epitaxial layer 318 is greater than a concentration of germanium (P-type transistor) or carbon/phosphorus (N-type transistor) in the second buffer layer 316. Preferably, there is concentration gradient of carbon/phosphorus in the epitaxial layer 318 which increases forward to the recess opening 312. The method for forming the epitaxial layer 318 comprises a third SEG process which comprises a single layer growth process or a multi layers growth process, wherein the concentrations of germanium, carbon or phosphorus can be gradually increased. However, the forming method of the epitaxial layer 318 is not limited thereto. The first buffer layer 314, the second buffer layer 316 and the epitaxial layer 318 are collectively referred to an epitaxial structure 320.

Figure 8:
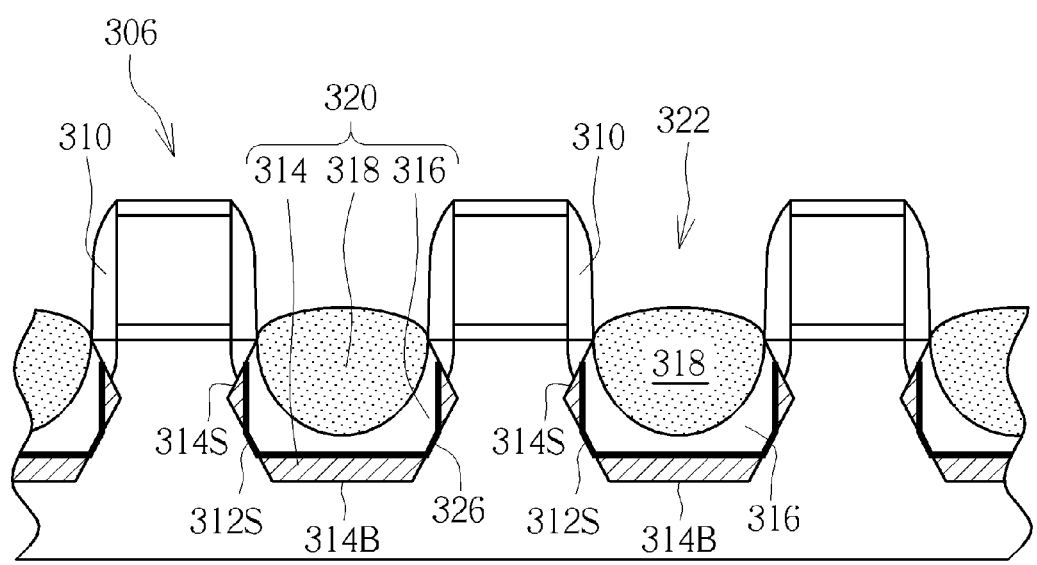

Subsequently, as shown in FIG. 8, an ion implantation process is conducted and a first conductivity type dopant is formed in all or a part of the epitaxial layer 318, thereby forming a source/drain region 322. In another embodiment, the first conductive type dopant can be implanted into the epitaxial layer 318 in-situ along with the third SEG process, so as to form the epitaxial layer 318 and the source/drain region 322 simultaneously.

Figure 9:
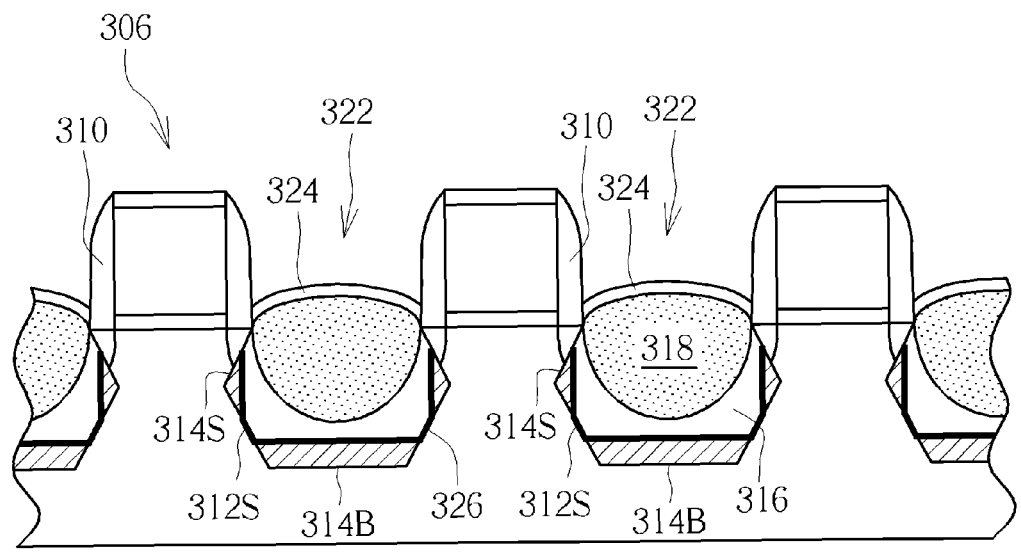

Next, as shown in FIG. 9, a covering layer 324 is formed conformally along top of the epitaxial layer 318. In one embodiment, the covering layer 324 comprises silicon-based material, and can be formed by a chemical deposition process (CVD) process for example. The covering layer 324 may be used as a sacrificial layer in the subsequent metal silicide process, to react with cobalt to form a metal silicide thereon. In another embodiment, the covering layer 324 may be omitted depending on the product design.

Thereafter, other components of a transistor can be formed, such as a metal silicide layer (not shown), a contact etching stop layer (CESL) (not shown), an inter-dielectric layer (ILD) (not shown). Alternatively, a metal gate replacement process can be performed to convert the gate structure 306 to a metal gate. These processes are well known to those skilled in the art and are not described for the sake of simplicity. Moreover, the foregoing embodiments take non-planar transistor for examples, but those skilled in the art would realize that the present invention may also be applied to planar transistors.

As shown in FIG. 9, the MOS device in the present invention includes a substrate 300, a gate structure 306, an epitaxial structure 320 and a source/drain region 322. The gate structure 306 is disposed on the substrate 300. The source/drain region 322 is disposed in the substrate 300 at two sides of the gate structure 306 and in at least a part of the epitaxial structure 320. The epitaxial structure 320 includes a first buffer layer 314, an optional semiconductor layer 326, a second buffer layer 316 and an epitaxial layer 318. The first buffer layer 314 is an un-doped region, which includes a bottom portion 314B and a side portion 314S. The bottom portion 314B is disposed on a bottom surface 312S, and the side portion 314S is disposed on the sidewall 312S of the recess 312. The side portion 314S is embedded into the substrate 300 and preferably has an isosceles triangle shape in its cross section. The second buffer layer 316 is a lightly doped region, which has a second conductive type and preferably has a curved top surface. In one embodiment, the second buffer layer 316 directly contacts the substrate 300 in the recess 312, such as the substrate 300 adjacent to the recess sidewall 312S, so the side portion 314S of the first buffer layer 314 and the bottom portion 314B of the first buffer layer 314 are separated by the second buffer layer 316. In another embodiment, a semiconductor layer 326 is disposed between the first buffer layer 314 and the second buffer layer 316. The epitaxial layer 318 is disposed on the second buffer layer 316, which is a strained stress layer. In one embodiment, the epitaxial layer 318 can protrude over the top surface of the substrate 300. The source/drain region 322 is disposed in all or a part of the epitaxial structure 320 and includes a first conductive type.

It is noted that since the bottom part of the epitaxial structure 320 is composed of the un-doped bottom portion 314B of the first buffer 314 and the doped second buffer layer 316 having the second conductive type, the leakage current can therefore be reduced. Moreover, the un-doped side portion 314S of the first buffer layer 314 can increase the stability of the lattice of the semiconductor material, thereby avoiding dislocation. Consequently, the epitaxial structure provided by the present invention can exhibit good property and avoid leakage current, thereby upgrading the electrical performance of the device.

Figure 10:
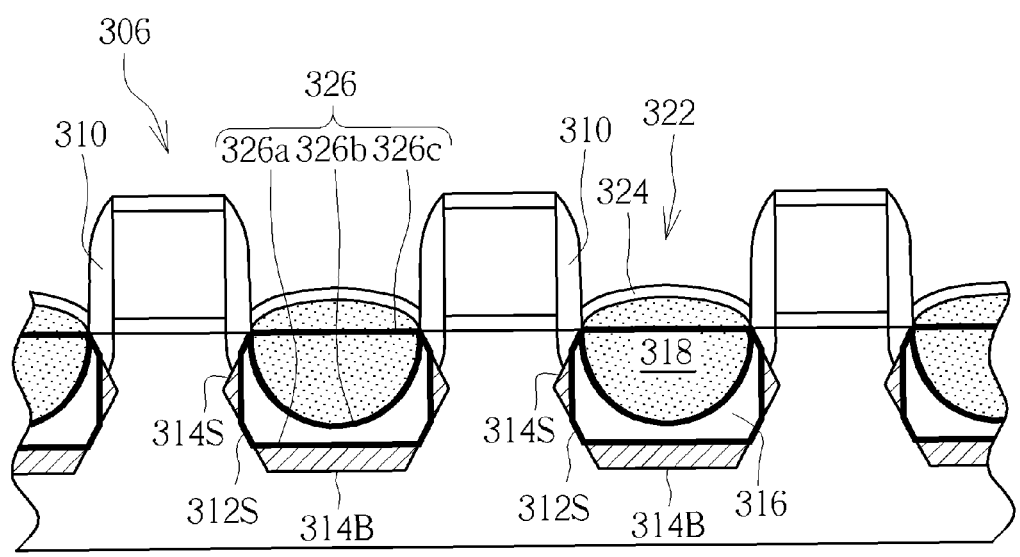
FIG. 10 shows a schematic diagram of the method of forming a MOS device according to another embodiment of the present invention.

Please refer to FIG. 10, which shows a schematic diagram of the method of forming a MOS device according to another embodiment of the present invention. As shown in FIG. 10, besides the previous embodiment that the semiconductor layer 326 is disposed between the first buffer layer 314 and the second buffer layer 316, in other embodiments, the semiconductor layer 326 can be disposed between the first buffer layer 314 and the second buffer layer 316, and/or between the second buffer layer 316 and the epitaxial layer 318, and/or between the epitaxial layer 318 and the top surface of the substrate 300, wherein all, two or one of the positions can be selected arbitrarily. The semiconductor layer 326 preferably includes single crystal silicon. By setting the semiconductor layer 326, the stability of the stress between each layer can be constructed, thus avoiding dislocation.

In summary, the MOS device provided in the present invention can provide superior electrical performance and avoid forming lattice, thereby upgrading the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal oxide semiconductor (MOS) device, comprising:
   a substrate;
   a gate structure disposed on the substrate;
   an epitaxial structure disposed in a recess in the substrate at two sides of the gate structure, wherein the recess comprises a bottom surface and a sidewall, and the epitaxial structure comprises:
      a first buffer layer, which is an un-doped buffer layer and comprising a bottom portion and a side portion, wherein the bottom portion is disposed on the bottom surface of the recess, the side portion is disposed on the sidewall of the recess;

an epitaxial layer, which is a strained layer and encompassed by the first buffer layer; and a semiconductor layer, disposed between the first buffer layer and the epitaxial layer; and a source/drain region, disposed in the epitaxial structure.

2. The MOS device according to claim 1, further comprising a second buffer layer which is a lightly doped buffer layer and is encompassed by the first buffer layer.

3. The MOS device according to claim 2, wherein the semiconductor layer is disposed between the first buffer layer and the second buffer layer, and/or between the second buffer layer and the epitaxial layer, and/or between the epitaxial layer and a top surface of the substrate.

4. The MOS device according to claim 1, wherein the sidewall of the recess is a concave sidewall and the side portion of the first buffer layer is disposed at the concave sidewall of the recess.

5. The MOS device according to claim 1, wherein the bottom portion of the first buffer layer does not contact the side portion of the first buffer layer.

6. The MOS device according to claim 1, wherein a maximum thickness of the bottom portion of the first buffer layer is greater than a maximum thickness of the side portion of the first buffer layer.

7. The MOS device according to claim 1, wherein a material of the semiconductor layer is different from a material of the epitaxial layer.

8. The MOS device according to claim 1 wherein the semiconductor layer comprises single crystal silicon.

9. The MOS device according to claim 1, further comprising a cap layer disposed on the epitaxial structure.

10. The MOS device according to claim 9, wherein the cap layer comprises silicon.

11. A method of forming a metal oxide semiconductor (MOS) device, comprising:

providing a substrate, with a gate structure disposed thereon;

forming an epitaxial structure in the substrate at two sides of the gate structure, wherein the step of forming the epitaxial structure comprises:

forming a recess in the substrate, wherein the recess comprises a recess bottom surface and a recess side surface;

forming a first buffer layer in the recess, wherein the first buffer layer is an un-doped buffer layer and comprises a bottom portion and a side portion, wherein the bottom portion is disposed on the recess bottom surface, the side portion is disposed on the recess side surface;

forming a semiconductor layer on the first buffer layer; and forming an epitaxial layer on the semiconductor layer, wherein the epitaxial layer is a strained layer and the epitaxial layer completely fill the recess; and forming a source/drain region in the epitaxial structure.

12. The method of forming a MOS device according to claim 11, wherein the recess side surface is a concave sidewall and the side portion of the first buffer layer is disposed at the concave sidewall.

13. The method of forming a MOS device according to claim 11, further comprising forming a second buffer layer between the semiconductor layer and the epitaxial layer, and the second buffer layer is a doped buffer layer.

14. The method of forming a MOS device according to claim 13, wherein the semiconductor layer is disposed between the first buffer layer and the second buffer layer, and/or between the second buffer layer and the epitaxial layer, and/or between the epitaxial layer and a top surface of the substrate.

15. The method of forming a MOS device according to claim 11, wherein the bottom portion of the first buffer layer does not contact the side portion of the first buffer layer.

16. The method of forming a MOS device according to claim 11, wherein a maximum thickness of the bottom portion of the first buffer layer is greater than a maximum thickness of the side portion of the first buffer layer.

17. The method of forming a MOS device according to claim 11, wherein a material of the semiconductor layer is different from a material of the epitaxial layer.

18. The method of forming a MOS device according to claim 11, wherein the semiconductor layer comprises single crystal silicon.

19. The method of forming a MOS device according to claim 11, further comprising forming a cap layer disposed on the epitaxial structure.

20. The method of forming a MOS device according to claim 19, wherein the cap layer comprises silicon.

* * * * *